United States Patent [19]

Frederickson et al.

[11] Patent Number: 5,160,374

[45] Date of Patent: Nov. 3, 1992

[54] PROCESS AND APPARATUS FOR PREVENTING THE PULSE DISCHARGE OF INSULATORS IN IONIZING RADIATION

[75] Inventors: Arthur R. Frederickson, Carlisle, Mass.; Joseph E. Nanevicz, Palo Alto; Jeffrey S. Thayer, Simi Valley; Dean B. Parkinson, Redwood City, all of Calif.

[73] Assignee: The United States of America as represented by the Secretary of the Air Force, Washington, D.C.

[21] Appl. No.: 557,285

[22] Filed: Jul. 24, 1990

[51] Int. Cl.$^5$ .................... C04B 14/36; H01B 1/20; C09K 3/16

[52] U.S. Cl. .................... 106/401; 106/400; 106/455; 106/287.19; 361/212; 361/220; 428/922; 428/931; 252/500; 252/511

[58] Field of Search .......... 361/212, 220; 428/922, 428/931; 252/500, 511; 106/400, 401, 455, 287.19

[56] References Cited

U.S. PATENT DOCUMENTS

| | | | |
|---|---|---|---|
| 3,984,730 | 10/1976 | Hunter | 317/2 D |
| 4,489,906 | 12/1984 | Fellas | 244/158 A |
| 4,755,231 | 6/1988 | Kurland et al. | 136/244 |
| 4,797,325 | 6/1989 | Verdun et al. | 428/473.5 |
| 4,889,750 | 12/1989 | Wiley | 361/212 |
| 4,910,050 | 5/1990 | Oldham et al. | 427/386 |
| 4,981,544 | 1/1991 | Nordale | 361/212 |

FOREIGN PATENT DOCUMENTS 1-146970 6/1989 Japan .

OTHER PUBLICATIONS

CA 111(26):235241d "Transparent Heat Resistant Electrically Conductive Coating Compositions", JP01-146970 Jun. 8, 1989.
WPI : AN-89-210099/29, also of JP01-146970 Jun 8, 1989.
A. R. Fredrickson et al., "Leaky insulating Paint for Preventing Discharge Anomolies on Circuit Boards", IEEE Transactions on Nuclear Science, vol. 36, No. 6, Dec. 1989.

Primary Examiner—Karl Group
Assistant Examiner—Scott L. Hertzog
Attorney, Agent, or Firm—Stanton E. Collier; Donald J. Singer

[57] ABSTRACT

A semi-insulating coating or surface layer is applied over insulating materials such as a circuit board or wiring harness or feedthrough insulator. The paint is electrically fixed to ground and as a result leaks away charge buildup before large pulse discharges occur. For example, pure tin oxide particles in phenoxy resin binder forms a paintable application for the invention.

31 Claims, 2 Drawing Sheets

PROCESS AND APPARATUS FOR PREVENTING THE PULSE DISCHARGE OF INSULATORS IN IONIZING RADIATION

STATEMENT OF GOVERNMENT INTEREST

The invention described herein may be manufactured and used by or for the Government for governmental purpose without the payment of any royalty thereon.

BACKGROUND OF THE INVENTION

The present invention relates to electrical insulators such as electronic circuit boards and integrated circuit packages, and, in particular, to electrical discharges from such caused by ionizing radiation.

As the radiation hardness of electronic devices improves these devices will be able to survive increasingly higher levels of environmental irradiation. For photon or electron irradiations which produce surface doses exceeding 100 krad, the insulating materials become prone to prebreakdown discharges which can produce voltage pulses sufficient to damage or to electrically interrupt adjacent sensitive electronic devices. Insulation exposed to space radiation often becomes electrostatically charged so that the surface of the insulators are at a level of +10 to −10,000 volts relative to other elements of the spacecraft. When a spontaneous discharge initiates, it may propagate so that a large surface area is rapidly discharged. This rapid discharge of a large surface area results in a significant electrical pulse in adjacent or attached electrical circuits.

Nevertheless, it is known that damaging pulses do not occur when the insulator materials are coated with good "grounded" conductors. This solution can not be applied on many circuits where the possibility of a short circuit must be avoided. A plasma can be used to ground the surface and eliminate large pulses as effectively as a good conductor. The space plasma at many orbits is sufficient to do this naturally and is the main reason for large discharges being rare on spacecraft.

It is true that the higher energy radiations penetrate through the coatings and stop in the underlying insulation thereby producing high voltage in the insulator. Normally these deeply buried charges cannot produce large pulses in most grounded-surface situations. The large pulses occur when the free surfaces (adjacent to vacuum or to a gas) are at high relative potentials.

The discharges begin to occur when the surface of the insulator at issue receives an accumulated dose which approximates or exceeds 100 krads for typical electron space spectra. The discharges can occur only when the electric fields are sufficient to cause them; dose is not the cause of the pulses. However, the electric fields will not attain the critical strength until sufficient irradiation or secondary electrons have been stopped in the insulator which occurs typically at 100 krads.

The minimum dose must be provided within the dielectric relaxation time, which is typically of the order of days to years, in order for pulses to occur. Most spacecraft insulators will not accumulate sufficient charge within this time frame, only insulators close to a spacecraft surface will experience such charging.

However, dose rates and electrical charging rates near the surface of insulators such as circuit boards, insulated wires, connectors, antenna insulators, sensor insulators, device encapsulants and electrical feedthroughs have not normally been considered in light of these charging mechanisms. If surface dose were routinely considered, more devices would probably be found to have this problem. Ground based testing of electronics is often performed to a megarad or more (inside the device encapsulants) within a short time. Electrons, gamma rays and x-rays are all capable of producing these discharges.

A weakly conducting surface coating prevents significant radiation-induced charging of surfaces. Also, it will not cause short circuit current paths between electrically active components. Its level of conductivity is engineered in order to prevent radiation induced charging while avoiding current leakage paths.

SUMMARY OF THE INVENTION

The present invention is a semi-insulating paint composition of tin oxide and phenoxy resin applied over the insulating material having a surface discharge problem. Other coatings of the semi-insulating type are also applicable.

The present invention is a surface coating or a semi-insulating paint which acts to continually conduct electrical charge between the insulated surfaces and the satellite frame or other suitable ground so that surface voltages remain very low at all times. Thus, spontaneous discharges result in only small pulses in the electrical circuits. Additionally, because surface voltages are limited, the number of spontaneous discharges which initiate during a specific time period is significantly reduced. The surface resistivity of the present invention can vary over a large range of values but must be chosen so that the incident electrical current provided by the space radiation produces no more than a plus or minus ten volt drop as it flows through the present invention. Additionally, the present invention must not provide an excessive leakage path for the biased circuits to which it may be connected. These two constraints cause most applications of the invention to lie in the range where surface resistivity is less than $10^{12}$ ohms per square and more than $10^6$ ohms per square. Lower resistivity can be used but is not necessary, and might result in excessive circuit leakage if the present invention is misapplied. And, finally, the present invention may be used alone or in conjunction with other materials as a conformal coating to stabilize the surface components.

The semi-insulating coating has a resistivity sufficient to bleed off radiation induced charging while producing less than about 10 volts. Brush applications result in a surface coating with surface resistivity on the order of $10^{10}$ ohms per square for common space service. At the highest current densities expected in space, such a coating when adequately "grounded" prevents the surfaces of the circuit boards from charging beyond a few tens of volts. At this charging level, the spontaneous pulses which occur are too small to harm most circuits.

One formulation, a paint, is a suspension of 0.5 micron diameter pure tin oxide particles in phenoxy resin. By weight, the tin oxide comprises 60% of the cured paint.

One object of the present invention is to provide a process and coating and/or paint to prevent the pulse discharges of insulating material in an ionizing environment.

Another object of the present invention is to provide a process and coating and/or paint to prevent large discharges from electronic devices in a space environment.

Another object of the present invention is to provide a process and coating and/or paint to reduce the voltage difference between the electronic reference and ground and insulated surfaces next to vacuum to 10 volts or less.

These and many other objects and advantages of the present invention will be readily apparent to one skilled in the pertinent art from the following detailed description of a preferred embodiment of the invention and the related drawings.

DESCRIPTION OF THE PREFERRED EMBODIMENT

Figure 1:
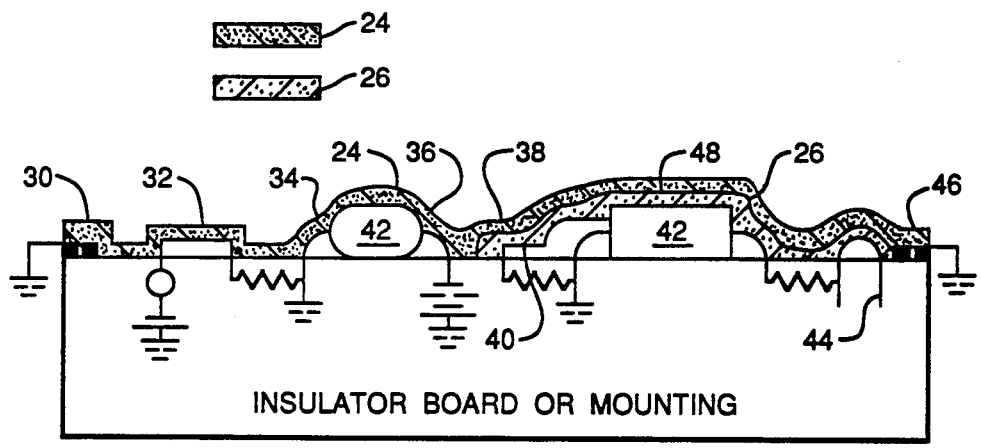
FIG. 1 illustrates by cross-section application of the coating of the present invention on only a partially shown circuit board.

The present invention is a semi-insulating paint that is applied on insulating material such as circuit boards that are exposed to ionizing radiation and such paint prevents or substantially reduces pulse discharges.

For space application, the semi-insulating paint has a resistivity on the order of about $10^6$ to $10^{10}$ ohm-cm. Brush applications result in a surface coating thickness with surface resistivity on the order of about $10^{10}$ ohms per square. At the highest current densities expected in space, such a coating when adequately fixed with respect to ground prevents the surface of the circuit boards from charging beyond a few tens of volts. At this charging level, the spontaneous pulses which occur are too small to harm most circuits.

The paint is a suspension of small semiconducting particles in a binder such as 0.5 micron diameter pure tin oxide particles in phenoxy resin. By weight, the tin oxide comprises 60% of the cured paint in order to attain the range of surface resistivity needed with reliability.

The paint is applied by brush, for example, and air dried at room temperature before exposure to vacuum. Negligible outgassing should occur after a week of cure when the solvents have outgassed. The paint may be applied over many surfaces but most importantly over a conformal coatings which are used on spacecraft circuit boards. At room temperature phenoxy resin, for example, requires several hours to sufficiently bond to the conformal coat.

The resistivity of pure tin oxide can be order $10^4 - 10^7$ ohm-cm so that even if there are locally high concentrations of the tin oxide, no short circuits can develop. Changes of a few percent or so in tin oxide concentration are not expected to significantly alter the bulk resistivity.

For paint formulations of the invention, it is important to use a high resistivity conductor additive so that there is no chance for local regions of high conductivity. If carbon or metal powders are used instead of tin oxide, then the concentration of conductor would need to be reduced to less than 25%. For concentrations this low, a small change in the concentration would result in a large (many orders of magnitude) change in the conductivity and thus the conductivity of a metal-filled paint can not be held within the necessary range.

One embodiment of the invention, tin oxide particles in phenoxy resin, a semi-insulating paint, has been tested on urethane-coated multilayer G-10 circuit boards. Results can be summarized: a) Cure times of less than an hour resulted in bubbles between the paint and the solithane upon evacuation. 48 hour cure resulted in no bubbles upon evacuation. b) The paint film by itself is exceedingly strong once cured. c) After several days cure, pull tests indicated that 0.1 Newtons are required to peel a mm wide strip from the circuit board. Adhesion further increased with age. d) Partial (20%) delamination can be induced by rapid cycling from room temperature to immersion in liquid nitrogen. Temperature cycling between $-20°$ C. and $100°$ C. shows no ill effects after 5 cycles in 4 hours. e) 70 megarads of radiation during a 70 hour period by Cobalt 60 exposure caused slight yellowing of the paint but no degradation of electrical or mechanical properties. f) Multiple brush stroking improved adhesion to solithane. g) After one coat brush application, thicknesses ranged from 0.005 to 0.025 cm.

ASTM method D257-78 was used to measure the surface resistivity of several samples. The surface resistivity measured on the samples varied, at room temperature, between $1.0 \times 10^{10}$ and $5.0 \times 10^{10}$ ohms per square. A surface resistivity in the range of $10^6$ to $10^{12}$ ohms per square is considered acceptable for space application.

Referring to FIG. 1, a typical application of a semi-insulating paint 24 is illustrated. The paint 24 must be connected to the satellite frame or to the low voltage, low impedance to ground wiring. Points 30, 34, 36 and 46 exhibit these features. The paint 24 must cover all insulating surfaces such as circuit board material between 30 and 32 or wire insulation as at 32 and 36, or integrated circuit packaging as at 42 or other exposed insulation conformal coatings as shown between 38 and 46. The paint 24 may act as a conformal coating as shown between 30 and 38. Or, the paint 24 may act as a cover layer for other existing conformal coatings as shown between 38 and 46. A highly insulating coating may be placed on selected wiring in order to minimize unwanted leakage currents as shown at 40 through 44 but the insulated coating must be covered by the paint 24 as shown between 38 and 46. The total space radiation current impacting the surface area between 38 and 46 must not cause the voltage at 48 to exceed the voltage at 38 or at 46 whichever is greater in magnitude by more than roughly ten volts. This requirement establishes an upper limit for the surface resistivity of the paint 24, typically less than $10^{12}$ ohms per square.

The surface resistivity of the paint 24 must be sufficiently high so that currents between 32 and 34 or between 30 and 32 are not so high as to degrade the operation of circuits connected to 32 or 34. This typically results in a requirement for minimum surface resistivity of $10^6$ ohms per square, or higher in a few applications. A typical application of the paint 24 would have surface resistivities in the range from $10^6$ to $10^{12}$ ohms per square. Nearly all space related applications will be satisfied by a surface resistivity of $10^9$ ohms per square. Particular applications may require higher or lower values for the surface resistivity of the paint 24.

Figure 2:
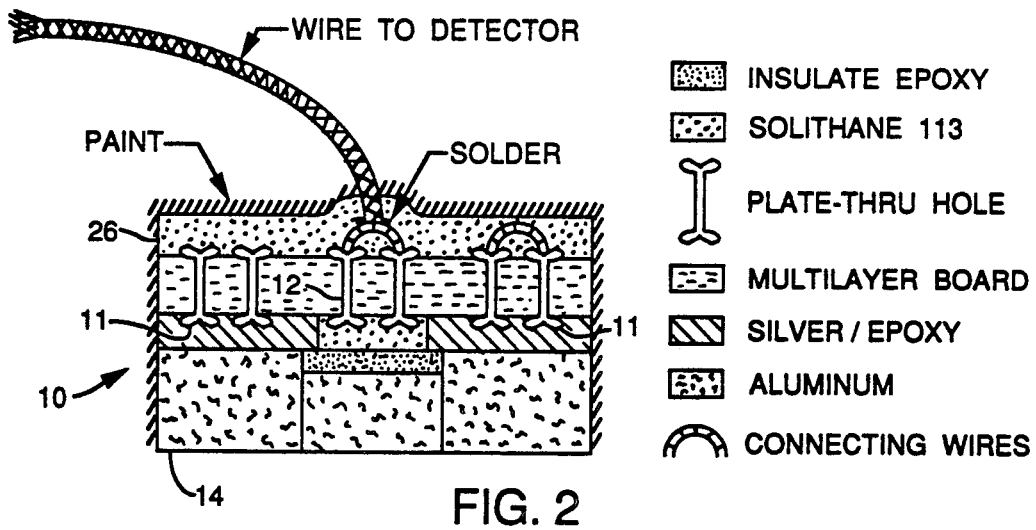
FIG. 2 illustrates by cross-section an electronic structure to test the coating of the present invention.

FIG. 2 describes the construction of a test sample 10. Other geometries were tested but the simplest geometry provided the most consistent test of the effectiveness of the paint, alone. A properly designed circuit board will avoid floating metalizations and will contain a sufficiently hard ground plane as does this geometry. The purpose of this geometry is twofold: a) to prove that, without the invention, dangerous pulses result even when all metals on a board are grounded, and b) to show that the invention, such as a semi-insulating paint, can remove the dangerous pulses in a well designed experimental protocol, without loading or shorting the adjacent circuits.

The samples 10 were cut from existing circuit boards into 5 cm×5 cm squares. A small number of the plate-through holes 12 were wired together while remaining isolated from the others; the wired holes 12 were connected to a pulse detector. Metalizations exposed at the edges and all other plate-through holes were grounded using conductive epoxy or solder and wires. There were 9 layers of metalization in these G-10 boards. The aluminum back-plane 14 also served as the sample ground plane. The circuit being monitored for pulses 12 was isolated using insulating epoxy as shown in FIG. 2.

Figure 3:
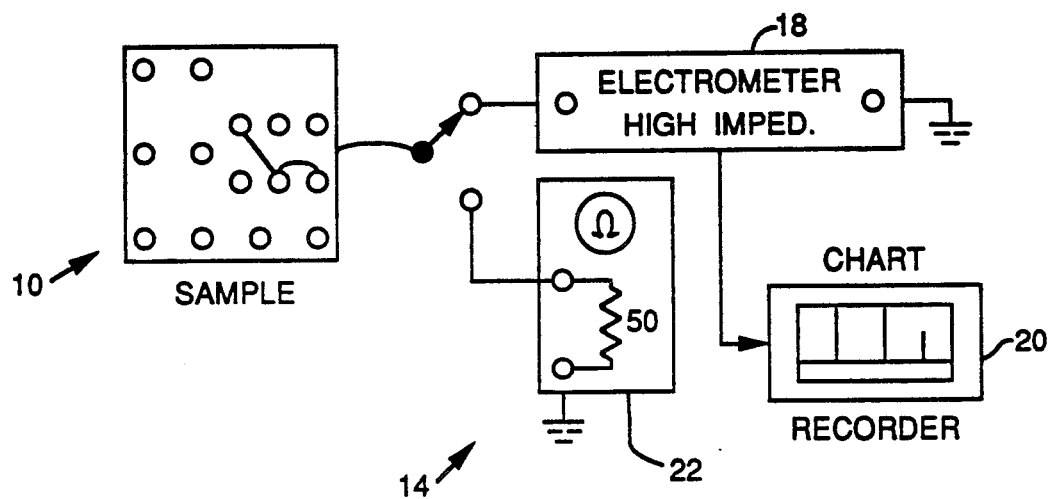
FIG. 3 illustrates the test apparatus for testing the electronic structure of FIG. 2.

FIG. 3 shows the pulse measuring apparatus 16. A vacuum tube Keithley model 410 electrometer 18 was used for most of the data because, in combination with a chart recorder 20, it would capture all pulses. In previous tests of a similar nature it was found that the input circuits of more modern solid state electrometers would fail due to the largest pulses from the samples. The chart recorder 20 deflection measures, directly, the total charge transferred during a pulse. Alternatively, the oscilloscope 22 could be used to measure the voltage vs. time waveform developed on its 50 ohm terminating resistor.

For such samples, it was found that pulses are always shorter than 1 microsecond. The electrometer 18 response time was always the same, approximately a half second so that the output of the electrometer 18 was a characteristic of its response time and not of the samples's pulse waveshape. Thus, the chart recorder 20 always showed the same pulse widths which were about one second wide. Since the width of the chart pulse never varied, the height of the pulse is proportional to its area and the area is proportional to the total charge which was output by the electrometer 18. The height of the chart recorder 20 deflection alone contained all the information that the electrometer 18 was able to provide. The electrometer sensitivity was adjusted so that it and the chart recorder 20 were not driven off scale by the pulses. The height of the chart recorder pulses was experimentally calibrated and the results were in agreement with the view that the time integral of the electrometer output pulse equaled the time integral of the input pulse from the sample. Thus the output pulse into the chart recorder 20 was a direct measurement of the total charge which flowed in the sample discharge.

The chart recorder 20 was calibrated by discharging capacitors of 10 to 100 pF at voltages from 1 to 100 directly into the electrometer 18. This covered the full range of actual pulse widths and voltages which were produced by the samples 10. The response was perfectly linear. The height of the chart recorder deflection was directly proportional to the charge initially on the capacitor. Thus, for example, discharging a 10 pF capacitor at 100 volts into the electrometer 18 produced the same chart recorder deflection as did discharging a 100 pF capacitor at 10 volts.

The oscilloscope 22 was used to determine the magnitude of voltage developed on a 50 ohm line by actual sample pulses. Thus the oscilloscope 22 was used to measure pulse voltages and was correlated (by experiment using discharging capacitors as well as actual sample pulses) to the chart recorder 20 which measured total charges transferred during the pulse. Because the scope indicated that all pulses were in the range from 10 to 100 nanoseconds long, the chart recorder deflections can be used to estimate the peak voltage induced on a 50 ohm line. Most test were performed using the chart recorder in order not to miss any pulses.

High levels of electron flux were used to appropriately simulate worst case space flight, the worst case test of the semi-insulating paint. In addition, on some samples the electron fluence was varied from 0.01 to 10 nanoamperes per square cm to establish the fact that pulse rates (number of pulses per hour) varied roughly linearly with flux and that pulse sizes remained unchanged when flux was varied. Electrons from a Dynamitron accelerator were used. Most tests were run at 250 keV. At higher energies the beams became more monoenergetic, and pulse rates dropped off above 700 keV where a significant fraction of the electrons passed through the samples.

Table I describes the results using the geometry defined in FIG. 2. Further results for other geometries establish that larger pulses result from both larger samples and from samples which lack numerous grounded metalizations.

The electrometer 18 and the oscilloscope 22 were also cross calibrated by using actual sample discharges. A sample was irradiated at a high level of 10 nanoamperes per square cm in order to induce a high pulse rate of nearly one per minute. The oscilloscope showed consistent pulses of 40 volts peak and 50 nanoseconds FWHM on 50 ohms, which equates to roughly 40 nanocoulombs in the pulses. For these conditions, the chart recorder also registered 40 nanocoulombs. Therefore the chart recorder deflection truly indicated the amount of charge passed through a 50 ohm discharged path. It is important to note that 50 ohms is rarely a good simulation of circuit board impedances, they are usually higher, so that larger voltage pulses (but smaller current) would be expected on most circuit board wiring.

If one assumes that all pulses from the samples had the same shape as above, then it turns out that a pulse of N coulombs corresponds to a pulse of approximately the same N volts on 50 ohms. The last column in Table I may be thereby interpreted as a guide to the peak voltage developed on 50 ohms, as well as a true as a true measure of the total charge transferred during the pulse.

TABLE 1

CONTROLLED EXPERIMENTS IN THE SAME GEOMETRY UNDER APPROXIMATELY 0.4 nA/cm$^2$ ELECTRONS IN THE RANGE 100-700 keV.

| SAMPLE ID WITH OR WITHOUT PAINT | # OF PULSES SEEN | DURING IRRADIATION TIME OF (SECONDS) | LARGER PULSE SIZES (nC) |
|---|---|---|---|
| C, WITHOUT | 12 | 3600 | 30 |
| C, WITH | 2 | 6800 | 1 |
| F, WITHOUT | 18 | 3600 | 10 |
| F, WITH | 0 | 10200 | |
| J, WITHOUT | 13 | 4000 | 30 |
| J, WITH | 1 | 5000 | 1 |
| P, WITH | 0 | 5500 | |
| T, WITH | 0 | 4000 | |
| U, *** | 10 | 8000 | 2 |

TABLE 1-continued

CONTROLLED EXPERIMENTS IN THE SAME
GEOMETRY UNDER APPROXIMATELY 0.4 nA/cm$^2$
ELECTRONS IN THE RANGE 100–700 keV.

| SAMPLE ID WITH OR WITHOUT PAINT | # OF PULSES SEEN | DURING IRRADIATION TIME OF (SECONDS) | LARGER PULSE SIZES (nC) |
|---|---|---|---|
| V, WITHOUT | 6 | 2700 | 20 |

For the paint to do its job, it must be connected to some semblance of ground; geometries without a ground are not tenable. Yet, the impedance of the paint is so high that it acts as an insulator during the propagation of a pulse. Sample U, *** was painted but the paint did not overlap the edges of the circuit board and was in contact with "ground" only where it touched the signal wire. Radiation-induced conductivity through the conformal coat to the grounded circuit wiring may also have helped to hold the paint surface voltage to a low enough level to prevent the larger pulses from occurring. In any case, as the connection to ground is made more resistive, the IR voltage drop (where I is the stopped irradiation electron current and R the effective surface to ground resistance) will result in higher surface voltages during irradiation. If pulses occur, the higher surface voltage will result in larger pulses.

Figure 4:
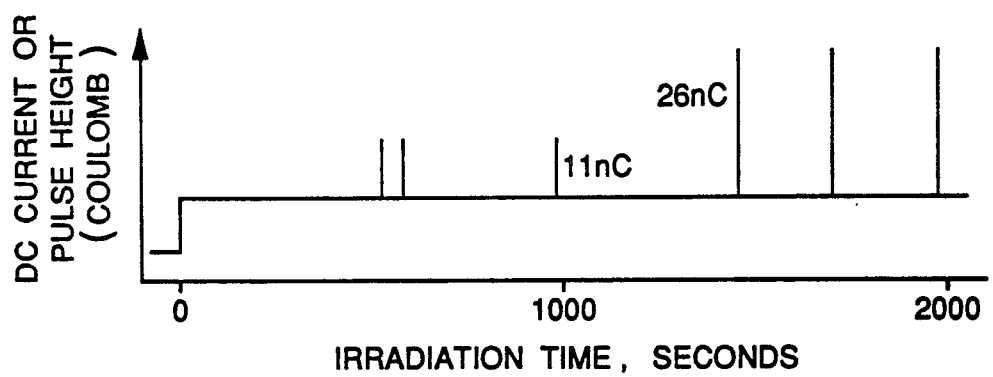
FIG. 4 illustrates pulse discharges from the electronic device.

FIG. 4 is a chart recorder tracing of a typical result during electron irradiation without the paint, and later pulses during this irradiation were even larger. The average value (in nC) of the several larger pulses is listed in Table I for each sample. Experiments with fluxes down to 10 pA/cm$^2$ produced the same size pulses but the pulse rate decreased roughly in proportion to the flux rate; however, it would take an inordinate time to verify the proportionality at lower fluxes. In agreement with the literature on radiation induced insulator pulses, larger samples produced both more pulses per second as well as larger pulses.

Although FIG. 4 shows only "negative" pulses, pulses which correspond to electrons arriving on the signal wire, both polarities were frequently seen. "Negative" pulses correspond to pulses where electrons from a negative surface somewhere on the circuit board arrive on the signal wiring during the discharge pulse. "Positive" pulses correspond to cases where negatively charged dielectric, located close to the signal wire, discharge to ground and not directly to the signal wire. The other two possibilities for positively charged dielectric exist, but are not expected to occur (except for rare circumstances) for these high energy electron irradiations. This description of pulse polarities is only presented as a picture, not as a complete description. Actual pulses depend on a complex interplay of features and are composed of the real charge currents as well as the displacement currents to the electrode (the wiring) actually attached to the detector.

A number of tests have been performed which proved that a semi-insulating paint can prevent damaging discharges. The semi-insulating paint is to be applied over electronic insulators where accidental application of 10$^8$ ohm loading is not a problem. It can be applied as a retrofit to existing circuit boards or included in the procedure for manufacture of future boards. It should also find application on electrical feed-throughs and other insulators where the normal attenuation of space radiations by the spacecraft skin is not sufficient to avoid pulses in the first place. The accelerated ground testing of electronics is certainly one glaring example of where the paint would be useful.

Gaps and bubbles under the paint adjacent to geometrically complex components appear to be a source of discharges as some preliminary tests have shown. Internal wiring with high bias levels is still a problem to be considered. High impedance lines may still have the problem depending on the voltage sensitivity of the attached components. The reliability of these paint films has not been tested against all space requirements (such as life cycle testing to ten years).

Clearly, many modifications and variations of the present invention are possible in light of the above teachings and it is therefore understood, that within the inventive scope of the inventive concept, the invention may be practiced otherwise than specifically claimed.

What is claimed is:

1. A process for substantially reducing electric discharges on circuit boards exposed to ionizing radiation, said process comprising the steps of:
   depositing a semi-insulating coating on electrical insulators, on electrical circuit boards, and on electrical insulating material thereon; and
   connecting the semi-insulating coating to a suitable electric potential point close to ground.

2. A process as defined in claim 1 further including the step of depositing a before conformal coating on the circuit board before said semi-insulating coating.

3. A process as defined in claim 1 wherein the semi-insulating coating has a square resistivity of about 10$^6$ to about 10$^{12}$ ohms per square.

4. A process as defined in claim 3 wherein said surface resistivity is about 10$^{10}$ ohms per square.

5. A process as defined in claim 1 wherein the semi-insulating coating is a paintable suspension of a relatively high resistivity conductive material in a relatively high insulative binder.

6. A process as defined in claim 5 wherein the semi-insulating coating is a paintable suspension of an oxide in a binder.

7. A process as defined in claim 6 wherein the paintable suspension is tin oxide in a phenoxy resin binder.

8. A process as defined in claim 7 wherein the paintable suspension is from 20% to 90% by weight tin oxide of the cured paint.

9. A process as defined in claim 1 wherein the coating is a pyrolized polyimide film.

10. A process for substantially reducing electric discharges from an insulating material exposed to ionizing radiation, said process comprising the steps of:
    depositing a semi-insulating surface layer on the insulating material; and
    connecting the semi-insulating surface layer to a suitable electric potential point close to ground.

11. A process as defined in claim 10 further including the step of depositing a conformal coating on the insulating material before said layer.

12. A process as defined in claim 10 wherein the semi-insulating surface layer has a surface resistivity of about 10$^6$ to about 10$^{12}$ ohms per square.

13. A process as defined in claim 12 wherein said surface resistivity is about 10$^{10}$ ohms per square.

14. A process as defined in claim 12 wherein the semi-insulating surface layer is a paintable suspension of a relatively high resistivity conductive material in a relatively high insulative binder.

15. A process as defined in claim 14 wherein the semi-insulating surface layer is a paintable suspension of an oxide in a binder.

16. A process as defined in claim 15 wherein the paintable suspension is tin oxide in a phenoxy resin binder.

17. A process as defined in claim 16 wherein the paintable suspension is from 20% to 90% by weight tin oxide of the cured paint.

18. A process as defined in claim 10 wherein the surface layer is a pyrolized polyimide film.

19. A process as defined in claim 10 wherein the coating is a pyrolyzed polyimide surface layer where the pyrolysis is produced by irradiation or thermal treatment of a prior polyimide surface.

20. An apparatus having thereon insulating material, said apparatus being exposed to ionizing radiation whereby electric discharges occur from said insulating material, the improvement in said apparatus comprising: a semi-insulating surface layer applied over the insulating material; and an electrical ground connection to said semi-insulating surface layer whereby the electric discharges are substantially reduced while there is no possibility that the surface layer will electrically short the circuit to which it is applied.

21. An apparatus as defined in claim 20 wherein said surface layer has a surface resistivity of about $10^6$ to about $10^{12}$ ohms per square.

22. An apparatus as defined in claim 20 wherein said surface layer is a paintable suspension of a conducting material in an insulating binder.

23. An apparatus as defined in claim 22 wherein said paintable suspension is a suspension of a relatively high resistivity conductive additive in an insulating binder.

24. An apparatus as defined in claim 23 wherein said paintable suspension is an oxide in a resin.

25. An apparatus as defined in claim 24 wherein said paintable suspension is tin oxide in a phenoxy resin binder.

26. An apparatus as defined in claim 25 wherein said paintable suspension is from about 20% to about 90% by weight tin oxide when cured.

27. A process for substantially reducing electric discharges from an insulating material exposed to ionizing radiation, said process comprising the steps of:
   causing the surface layer of the insulating material to become semi-insulating; and
   connecting the semi-insulating surface layer to a fixed low potential relative to common ground.

28. A process as defined in claim 27 wherein the surface layer is made semi-insulating to the level of about $10^6$ to $10^{12}$ ohms per square.

29. A process as defined in claim 28 wherein the surface layer is made semi-insulating by the addition of a chemical dopant.

30. A process as defined in claim 28 wherein the surface layer is made semi-insulating by thermal pyrolysis or by irradiation.

31. A process as defined in claim 28 wherein the existing surface is a polyimide which is made semi-insulating by the thermal pyrolysis or by irradiation.

* * * * *